United States Patent [19]

French

[11] Patent Number: 4,489,288
[45] Date of Patent: Dec. 18, 1984

[54] HIGH FREQUENCY PULSE GENERATING CIRCUIT

[75] Inventor: John French, Lowestoft, England

[73] Assignee: Mars, Limited, Slough, England

[21] Appl. No.: 335,369

[22] Filed: Dec. 29, 1981

[30] Foreign Application Priority Data

Dec. 31, 1980 [GB] United Kingdom ............ 8041592

[51] Int. Cl.³ ............................................. H03B 9/10
[52] U.S. Cl. .................................... 331/87; 307/268; 328/67
[58] Field of Search ............... 307/264, 268, 571, 584, 307/246; 328/66, 67, 68, 232, 246, 247; 331/87

[56] References Cited

U.S. PATENT DOCUMENTS 3,296,551 1/1967 Staples ............................. 328/67
3,611,211 10/1971 Theodore ......................... 328/67
4,076,996 2/1978 Maehara ........................... 328/67

Primary Examiner—John Zazworsky
Attorney, Agent, or Firm—Curtis, Morris & Safford

[57] ABSTRACT

A circuit for generating high frequency output pulses comprising a magnetron, a pulse transformer having its secondary winding coupled to apply firing pulses across the input terminals of the magnetron, charge storage means connected in circuit with the primary winding of the pulse transformer, and switching means for discharging the charge storage means through said primary winding to generate a firing pulse from said secondary winding, said switching means comprising an FET switching device having output terminals connected in series with said primary winding, and a control terminal, and a control circuit adapted to deliver low voltage (e.g. less than 20 volts) pulses to said control terminal.

9 Claims, 4 Drawing Figures

HIGH FREQUENCY PULSE GENERATING CIRCUIT

FIELD OF THE INVENTION

This invention relates to a circuit for generating high frequency output pulses utilising a magnetron and has particular, though not exclusive, application in the generation of radar pulses.

BACKGROUND OF THE INVENTION

In order to energise a magnetron, so that it will oscillate and generate a high frequency output pulse, it is necessary to apply across its anode and cathode a voltage pulse normally exceeding 1 kilovolt, which may be referred to as a firing pulse, and the magnetron then oscillates for a period approximately equal to the duration of the firing pulse. The power of the firing pulse normally will exceed 1 kilowatt. Because of the relatively high voltage and power involved, there have been special problems associated with developing circuitry capable of switching a firing pulse onto a magnetron. The circuits employed have generally been referred to in the art as modulators. One of the desirable characteristics of a modulator is that is should be capable of generating firing pulses of different lengths, so as to enable generation of magnetron output pulses of corresponding different lengths.

One type of modulator which has been employed is referred to as the line type modulator. This type utilises a delay line to define the firing pulse length, and in order to change this length more than one delay line is provided, these having different delay values, and relay switches are employed to switch between one line and another. The energy passing through the circuit at the point of switching is relatively high so that the problems normally associated with mechanical switching at relatively high energy levels occur. The output pulse from the delay line is applied to a pulse transformer which steps up its voltage for application across the magnetron. The output impedance of a line type modulator is roughly equivalent to that of the pulse transformer, with the result that only about half of the voltage which might nominally be expected can actually be made available across the transformer primary winding. Consequently, the turns ratio of the pulse transformer has to be increased to achieve the desired output voltage in the firing pulse. The higher the turns ratio, the narrower the range of different pulse lengths that may be satisfactorily transmitted through the pulse transformer.

Another prior type of modulator is known as the hard valve type modulator. This employs a high voltage vacuum valve which switches a voltage of several kilovolts directly across the magnetron. The hard valve has the advantage that it can be switched from conduction to non-conduction by means of a relatively low control voltage, and the output pulse length can be varied by varying the length of the input control pulses at this relatively low voltage level. However, the valve is large, requires typically between 10 and 20 watts of power for heating of its cathode, and requires a constant supply voltage of several kilovolts to be provided for switching on to the magnetron.

SUMMARY OF THE INVENTION

The present invention seeks to provide an improved circuit for generating high frequency output pulses from a magnetron.

The invention provides a circuit for generating high frequency output pulses comprising a magnetron, a pulse transformer having its secondary winding coupled to apply firing pulses across the input terminals of the magnetron, charge storage means having substantially no inductance associated therewith and connected in circuit with the primary winding of the pulse transformer, and switching means for discharging the charge storage means through said primary winding to generate a firing pulse from said secondary winding, said switching means comprising an FET (field effect transistor) switching device having output terminals connected in series with said primary winding, and a control terminal, and a control circuit adapted to deliver pulses to said control terminal whereby to produce firing pulses of a length defined by that of pulses from the control circuit. The pulses may be of less than one watt in power, and preferably are less than one milliwatt. It will be appreciated from this that the FET should be a power FET (i.e. one of the types capable of handling at least 1 ampere), and a power MOSFET is preferred.

In the preferred embodiment which will be described, the FET switching device is an n-channel enhancement mode VMOS power FET. Further, the control circuit is adapted to deliver pulses whose lengths are controllable, for example by means of a control signal.

The embodiment to be described has the advantages that the switching or circuit modification required to modify the pulse length is effected in a low-power part of the circuitry, no switching contacts in the high-energy path are required, the output impedance of the FET is relatively low thereby enabling a reduction of turns ratio on the pulse transformer which in turn enables the transformer to handle a wider range of pulse widths, and as compared with a hard valve modulator, it may be as much as 20 times smaller, requires no heating power, and does not require a constant supply voltage in the kilovolt range. Ordinary low-voltage solid state circuitry can be employed to generate the control pulses for switching the FET.

BRIEF DESCRIPTION OF THE DRAWINGS

In order that the invention may be more clearly understood an embodiment thereof will now be described, by way of example, with reference to the accompanying drawings.

In the accompanying drawings, which are diagrammatic.

GENERAL DESCRIPTION

Before referring to the structure and operation of the circuitry in any detail, the general principles involved will first be briefly described with reference to FIGS. 1 and 2 so as to assist in an understanding of the detailed explanation that will follow.

The radar operates continually in repeated cycles, at 1000 or more cycles each second. At the beginning of each cycle a very brief (for example, between 100 nanoseconds (ns) and 1 microsecond ($\mu$s)) pulse of very high frequency energy (for example at about 9450 MHz) is generated by a magnetron 2 (see FIG. 2) and this pulse of energy is transmitted from the transmitting section 4a of a scanner generally indicated at 4. The transmitted pulse is reflected from any objects which lie in its path and the reflected pulse or pulses, which may be referred to as echoes, are received at the receiving section 4b of the scanner 4.

Figure 1:
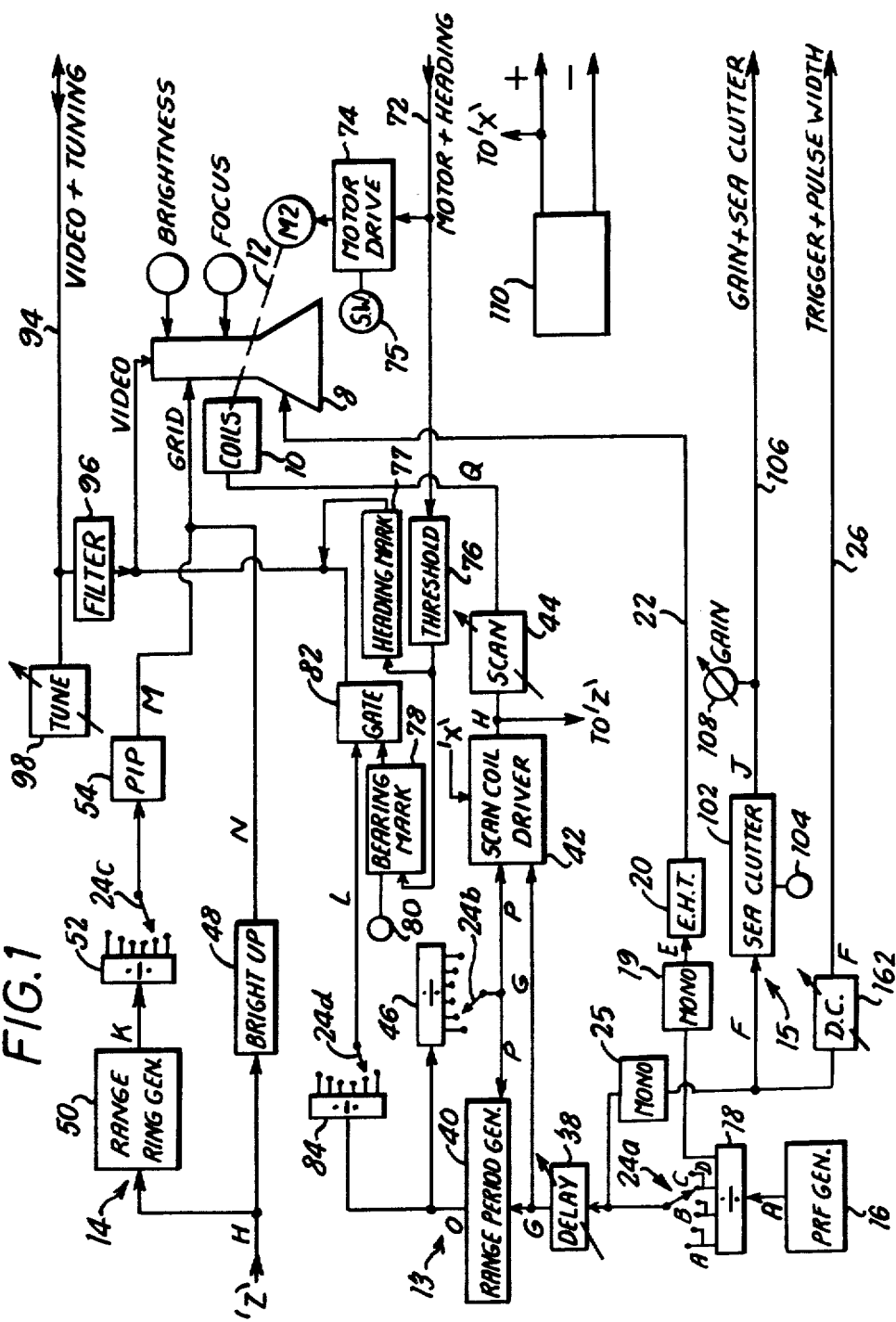
FIG. 1 shows the components which are located in the display unit.

A receiver, generally indicated at 6, converts the received very high frequency echo pulse to a demodulated video signal which is applied to the video input of a cathode ray tube (CRT) 8 which is shown in FIG. 1.

The beam of the cathode ray tube scans from its centre out to its periphery, the scan being commenced at the moment when the pulse is transmitted from the scanner. The video signal from the received echo brightens the scanning spot when it has travelled a distance proportional to the distance of the object which caused the echo. Consequently, as the spot makes a single sweep radially away from the centre of the tube face, bright points occur on the display at radial distances proportional to the distances away from the scanner 4 of any objects which have caused echoes of the original transmitted pulse to be returned to the receiving section of the scanner.

The scanner 4 is directional, and consequently any individual transmitted pulse will only produce echoes from objects which lie along the bearing on which that pulse was transmitted. In order to obtain on the face of the CRT 8 an indication of the features which lie in all directions around the scanner 4, the scanner is continually rotated by means of a motor M1 (FIG. 2) and at the same time the scanning coils 10 (FIG. 1) of the CRT 8 are rotated around the axis of the CRT by means of a further motor M2, the mechanical link between the coils and motor M2 being shown by a broken line 12. The rotation of the motors is kept in synchronism so that whenever a pulse is being transmitted in one particular direction the CRT spot is always travelling in a corresponding angular direction on the face of the CRT. As the scanner rotates, each successive pulse is transmitted in a slightly different angular direction and the angular position of successive scans on the CRT screen is similarly incremented, due to the synchronism of the two motors. The scanner and the CRT coils rotate on the order of once per second (the motors being geared down as necessary to achieve this) and the phosphor on the CRT screen persists in luminescence for at least this long, so that to the eye the large plurality of bright spots appearing on each of the angularly incremented sequence of scans on the tube face form a complete picture of the radar-reflecting features which surround the scanner.

Normally, it is required for the CRT screen display to be able to show the surrounding area on different scales. For example, when navigating in restricted conditions, such as entering a harbour, it may be desirable for the whole CRT screen area to show the surrounding area out to only half a mile radius, whereas in open sea it may be desirable for the screen to show the area out to, for example, 16 miles radius. In order to achieve such different ranges, the speed at which the CRT spot scans may be changed. It will be evident that the faster the spot scans from the screen centre to the screen periphery, then the closer to the scanner will be any object whose image appears on the screen at its periphery i.e. the whole screen area will be occupied by images from within a relatively shorter range around the scanner. Conversely, if the beam spot is made to scan more slowly, images appearing around the screen periphery will be from relatively more distant objects and the screen will be displaying an image of an area extending for a greater range around the location of the scanner. A portion of the circuitry in FIG. 1 which is employed to vary the rate of scan on the CRT face is generally indicated at 13.

At short range, it is desirable for the pulses transmitted from the magnetron to be very short because otherwise there will be substantial loss of definition on the CRT display, since a long received echo would extend over a substantial radial distance on the very fast-moving scanning spot. At longer ranges, longer pulses are desirable to produce a large enough bright spot with the spot travelling more slowly, and it is further advantageous to use longer pulses at longer ranges to increase the mean energy receivable in the echoes, which tend to be far weaker from distant objects than they are from near objects. The circuitry of FIGS. 1 and 2 contains components which vary the width of the transmitted pulse such as to match the range, or spot scanning speed, currently being used at the CRT.

To enable the user of the radar to estimate the distance of an object represented by an image on the screen, it is commonly required for the screen to continually display a plurality of rings concentric about its centre, and equally spaced. Circuitry for producing these rings by brightening the scanning spot at equal intervals as it travels away from the screen centre is generally indicated at 14 in FIG. 1.

A further facility normally required is a so-called "sea clutter" control. In rough weather at sea, the waves very close to the scanner cause substantial echoes and this results in an area immediately surrounding the screen centre being continually bright, which is normally undesirable. To avoid this, the gain of the receiver circuitry is substantially reduced during the initial portion of each sweep so that the screen centre area is reduced in intensity. The portion of the circuitry for achieving this is generally indicated at 15 in FIG. 1.

A detailed description of the circuitry and its operation now follows.

RADAR PULSE TRANSMISSION

A pulse repetition frequency generator 16 generates a square wave signal at a fixed frequency of 4000 Hz. The signal is shown at A in FIG. 3. This is applied to a divider 18 having outputs at which frequencies of 4000 Hz, 2000 Hz, 1000 Hz and 500 Hz are delivered, see waveforms A, B, C and D in FIG. 3. Signal D at 500 Hz is applied to a monostable circuit 19 which in response generates pulses E for application to an extra high tension circuit 20 which may be of known design and which via line 22 applies a voltage of several kilovolts to the anode of CRT 8.

Any one of signals A, B and C can be selected from the outputs of divider 18 by means of a range switch section 24a. It will be assumed for the purpose of the following explanation that it is signal C at 1000 Hz which is being selected by range switch section 24a (this would be appropriate for the longest two ranges available, 8 miles and 16 miles—see under "Range Changing" below). Throughout the circuitry there are further range switch sections 24b, 24c and 24d and all these sections are ganged together so that when the range switch is operated simultaneous changes are made at various points in the circuit so as to adapt it for operation at different ranges. They are shown set for the 8 mile range.

The leading edge of signal C causes a monostable circuit 25 to generate a trigger pulse F which is delivered on a line 26 to a three μsecond delay circuit 28. The purpose of the delay will be explained later. After that delay, circuit 28 delivers a signal R having a rising edge which when applied to a magnetron pulse width monostable circuit 30 causes it to generate a firing pulse S whose length is adjustable in a manner which will be described below. The firing pulse S is applied to a switching circuit 32 which discharges a capacitor 34 which has previously been charged to approximately 300 volts (the manner in which this charging is accomplished will be described later) through the primary winding of a pulse transformer 36. This causes a voltage in the region of 2 kilovolts to be induced in the secondary of pulse transformer 36, which voltage is applied across the magnetron 2 which emits a very brief pulse W of energy at 9450 MHz, or thereabouts, for transmission by the transmitting section 4a of scanner 4. The length of the pulse transmitted is variable by the above-mentioned adjustment of the length of the firing pulse S applied to the switching circuit 32.

A 30 second delay circuit 37 prevents transmission of the trigger pulse during 30 seconds after the circuit is first switched on, to ensure that magnetron 2 has warmed up before firing pulses are first applied to it.

CRT SCAN

The spot on CRT 8 should start its scan from the centre at the instant when the pulse is transmitted from scanner 4. An adjustment which enables this to be achieved in a manner which will become apparent, is provided by means of a delay circuit 38 whose delay is adjustable between about 1.5 microseconds and 4.5 microseconds. The leading edge of 1000 Hz pulse C emerges from delay circuit 38 (waveform G) and is applied to a range period generator 40 and to a scan coil driver circuit 42. This causes the range period generator 40 to start producing an output waveform O at a preset frequency and causes the scan coil driver circuit 42 to start producing a trace period pulse (waveform H), This is a constant voltage pulse (derived from a power supply 110 via connection x—x) and is applied through an inductive scan speed control circuit 44 to the scanning coils 10, which results in a linearly rising current (waveform Q) through the scan coils so as to produce linear deflection of the CRT beam. Circuit 44 comprises different inductance values which are selected automatically, through linkage of the circuit with the range switch, such that the total inductance of circuit 44 and the scanning coils 10 results in the gradient of this ramp signal and the consequent speed of the scanning spot on the tube face being appropriate to the range setting currently in use. From the above, it will be evident that the spot begins to scan from the CRT centre coincident with the leading edge of waveform G.

Since the timing of the leading edge of waveform G is adjustable by adjustment of delay circuit 38, the commencement of beam scan can be made coincident with transmission of radar pulse W. Imposition of the fixed 3 μs delay on pulse W enables adjustment of circuit 38 not only to retard, but also to advance, the timing of beam scan initiation relative to radar pulse transmission, and either may be necessary in a particular installation to compensate for unpredictable timing errors caused by component variations, and variations in the length of the cable connecting the display unit and the scanning unit, from one installation to another.

The duration of the CRT beam scan is controlled as follows. The fixed frequency pulses O from range period generator 40 are applied to a divider 46. This has a plurality of outputs for different division ratios and the outputs are selectable by means of a range switch section 24b. The division ratios at the different outputs of divider 46 are made such that, in conjunction with the predetermined frequency of range period generator 40, output pulses from the different outputs will be delivered at times (measured from the commencement of the beam scan) which will coincide with the times at which the scanning spot will reach the limit of its scan when travelling at the different speeds which are selectable as already explained by means of the range switch and the scanning speed control circuit 44. Consequently, the selected output of divider 46 delivers a pulse at the moment when the scanning spot is at its limit and this is applied both to the range period generator 40 to terminate its operation (see waveform O) and to the scan coil driver circuit 42 to terminate its constant voltage output pulse H, thus removing current from the scanning coils and allowing the scanning beam to fly back to the centre of the tube.

During the beam scan just described, pulse H is also applied to a bright-up circuit 48 which throughout the scan applies to the grid of CRT 8 a potential which brings the spot to the verge of visibility on the tube face, so that any significant video signal applied to the tube will make the spot visible. During the periods between scans of the spot, the bright-up circuit 48 keeps the tube beam suppressed so as to avoid the possibility of burning the centre of the CRT screen. The output of the bright-up circuit 48 is the constant voltage portion of waveform N.

RANGE RINGS

The range rings on the CRT display, already referred to, are produced as follows.

Beam scan pulse H from scan coil driver 42 is applied to a range ring generator 50 which throughout the duration of pulse H produces an output signal K at constant frequency independently of the other oscillators in the circuit. This is applied to divider 52 which again has outputs corresponding to diferrent division ratios which are individually selectable by means of range switch section 24c. Consequently after each predetermined number of pulses K (the number and hence the intervening time period being settable by range switch section 24c) a pulse from divider 52 is applied to a pip generating circuit 54 which generates a very brief pulse (waveform M) which is applied to the grid input of CRT 8. The frequency of ring generator 50 and division ratios of divider 52 are so arranged that four pip signals from generator 54 will be applied to the video input of CRT 8 at equal intervals. Consequently, since the tube scan rotates, the display shows four concentric equally spaced rings. The ring positions are the same irrespective of the range being employed, since the intervals between pips are selected to match the scanning speed being employed at the different ranges.

SCANNING SYNCHRONISATION

The motor M1 which rotates the scanner 4 is fixedly mounted to an elevated part of the boat and its output shaft indicated by the broken line 56 carries the scanner 4 and two discs 58 and 60. Disc 58 is formed with a predetermined number, for example fifty, of transparent portions or apertures 62 and disc 60 is formed with a transparent portion or cut-out 64. A light emitting and detecting assembly is shown schematically at 66, for directing light towards disc 58 at the radial position of the apertures 62, and detecting light which passes through the apertures. Consequently, the output of the detecting section of assembly 66 is a train of square pulses as indicated at 68 in FIG. 2, at a frequency proportional to the speed at which the scanner 4 is being rotated, which typically would be about 1 revolution per second, giving a pulse frequency of 50 pulses per second if disc 58 is provided with fifty apertures 62. Disc 60 is so orientated on shaft 56 that its transparent portion or cut-out 64 is aligned with a light-emitting and detector assembly 69 (similar to asssembly 66) when the scanner 4 is directed towards the head (i.e. forwards exactly along the fore-and-aft axis) of the boat. The relative orientation of discs 58 and 60 is such that the single brief pulses 70 derived from the detection section of assembly 69 each time the scanner passes the head of the boat are superimposed on one of the pulses 68 derived from the synchronisation disc 58. This combined signal is transmitted on line 72 to the display unit. In an alternative construction apertures 62 and cut-out 64 may be in a single disc.

At the display unit, the combined signal is applied to a motor drive circuit 74 which amplifies the received pulses and applies them as a driving signal to motor M2, which is a synchronous motor. Consequently, motor M2, if designed to rotate its output shaft once for every fifty pulses received, will rotate the coils 10 at the same speed as scanner 4 and correspondence between the positions of the two will be maintained. It should be noted that because the heading pulses 70 coincide with synchronisation pulses 68, they do not disturb the synchronisation between motors M1 and M2.

HEADING MARK

The combined pulse signal on line 72 is further applied to a threshold circuit 76 which passes the heading pulses 70 but not the synchronisation pulses 68. Pulses 70 are applied from the threshold circuit to a heading mark circuit 77. For each pulse, heading mark circuit 77 generates an output signal which lasts as long as two radial sweeps of the CRT spot (at the lowest sweep rate available), and which is applied to the video input of CRT 8. Thus, a solid radial marker line appears on the CRT display indicating thereon the boat's heading. This heading marker should extend from the screen centre to the exact top centre of the screen. This implies that when scanner 4 passes the head of the boat, the scan coils 10 in the display unit should be positioned so as to deflect the scanning beam from the CRT screen centre towards the exact top centre of the screen. This is achieved by means of a switch 75 which, when opened, stops circuit 74 from driving motor M2. Consequently, if at the start of operation the scanner and display angles are not matched, so that the heading marker is not at top centre, switch 75 can be opened to briefly stop motor M2 and angularly shift the heading marker, until it has the correct position on the display, at which point the scanner 4 and coils 10 will be in proper angular relationship.

BEARING MARK

A further aspect of the display is the provision of a bearing mark, that is to say a radial line on the screen which can be angularly adjusted by a control at the display unit so as to be aligned with any feature visible on the display. This enables, in conjunction with an angular index provided around the tube face, the bearing of such a display feature relative to the ship's heading (which is made always to coincide with the top of the screen and the zero position on the angular index) to be read off by an operator.

For this, pulses 70 are applied from the threshold circuit to a bearing mark circuit 78. Bearing mark circuit 78 responds to a heading pulse 70 by generating a pulse, the length of which can be adjusted between zero and the length of time taken for a complete rotation of the scanner 4, by means of a control 80. Further, bearing mark circuit 78 generates, upon termination of the variable-length pulse, an output pulse having a length equal to the time taken for the CRT spot to make two sweeps (again at the lowest available sweep repetition rate). The output pulse from bearing mark circuit 78 is applied to gate 82 and holds the gate open during two (or more) sweeps of the CRT spot. Applied to another input of gate 82 are pulses L, a plurality (in practice typically sixteen) of these being generated at equal intervals during the spot sweep as can be seen from FIG. 3. Consequently, during at least two successive spot sweeps the spot is brightened e.g. sixteen times per sweep so as to display a dashed line on the screen, this being a bearing mark. The angular position of that line about the screen centre is determined by adjustment of the control 80 on bearing mark circuit 78 which, as will be understood, determines how much time elapses between the CRT scan passing the top centre position and the beam being brightened to provide the dashed line. Thus, the desired bearing mark can be positioned on the CRT screen at any angular position to mark the bearing, relative to the ship's heading, of any feature on the display.

The pulses which are gated through gate 82 to provide the dashed bearing mark line are derived from the output signal O of range period generator 40, this signal being applied to a divider 84 which once again has a plurality of outputs for different division ratios. An individual output of divider 84 is selected by means of range switch section 24d. A lower division ratio is selected when the range switch is set to low range (i.e. high spot scanning speed), and vice versa, so that the bearing mark pulses L will be at frequencies proportional to spot scanning speed, whereby the bearing mark dashes on the screen will be identical irrespective of which range setting is in use.

RECEIVER

As referred to above, the radar pulse is transmitted from section 4a of the scanner at the moment when the CRT beam initiates its radial scan. An echo pulse is received from an object lying in the instantaneous direction of the scanner 4 after a delay dependent upon the distance of the object from the scanner and the echo pulse is received at the receiving section 4b of the scanner. Its frequency is the same frequency as the output of magnetron 2. In known manner, the received pulse is mixed in a mixer 86 with the output from a local oscillator 88 to generate an intermediate frequency which is amplified by intermediate frequency amplifier 90 and then filtered by filter 92 to provide a video signal which represents the envelope of the original received echo. The video signal is transmitted on line 94 to the display unit where it passes through a high pass filter 96 and is applied to the video input of CRT 8, so as to brighten the scanning spot at a radial distance from the screen centre which is proportional to the actual distance from the scanner of the object which produced the echo.

The local oscillator 88 may be of any known kind but it is preferred to employ an oscillator, such as a Gunn-effect oscillator, whose output frequency can be adjusted by adjustment of the level of a d.c. input signal. Local oscillator 88 in the described embodiment is of this kind. The d.c. signal for tuning its output frequency is provided by an adjustable tuning circuit 98 at the display unit (FIG. 1) and applied via the same line 94 that carries the video signal and via a low-pass filter 100 to a tuning input of local oscillator 88. Since filter 96 is a high-pass filter this d.c. signal does not affect the video input of CRT 8, and since filter 100 is a low-pass filter, the video signal from the output of filter 92 is not fed to the tuning input of local oscillator 88. Thus, by adjusting the d.c. voltage provided by tuning circuit 98, the frequency of local oscillator 88 can be adjusted so as to provide optimum amplification of the received echo in the receiving section of the circuitry.

GAIN CONTROL AND SEA CLUTTER CIRCUITRY

A gain control circuit 108 is manually adjustable to generate a constant but adjustable d.c. gain control voltage which is applied by line 106 to a gain control input of intermediate frequency amplifier 90.

Figure 3:
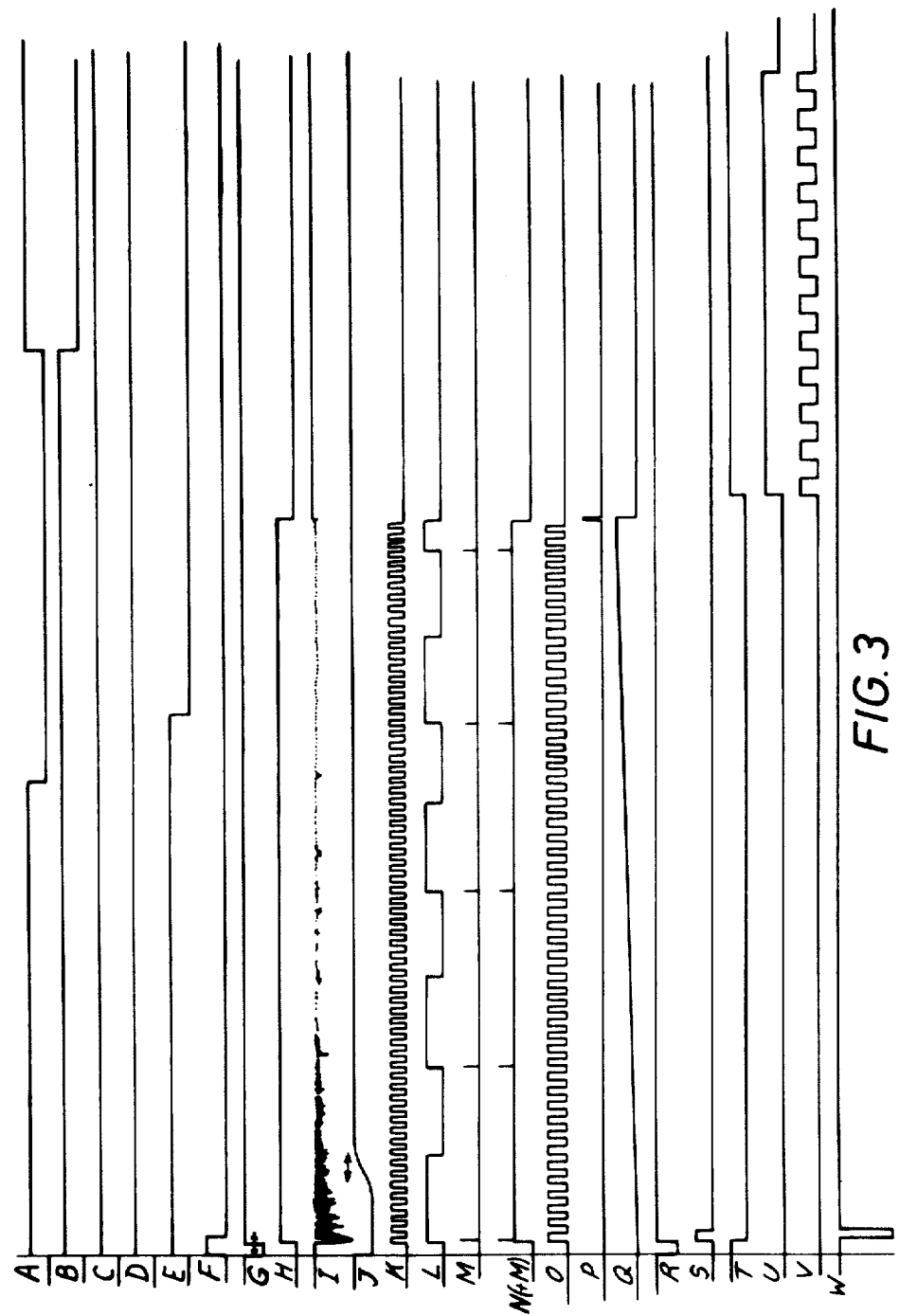
FIG. 3 is a timing diagram showing the various waveforms that occur in various parts of the circuitry, these being identified by reference letters in the Figure, and the same reference letters being used to indicate where the waveforms occur in the circuitry of FIGS. 1 and 2.

Referring to FIG. 3, waveform I illustrates the form of the video signal when echos are being received from rough water. It can be seen that the earliest echoes are of substantial amplitude and would cause the CRT display to have a bright patch around its centre which as already mentioned is undesirable.

This can be eliminated by means of the sea clutter circuit 102 (FIG. 1) which receives the trigger pulse F and generates an output signal J having an adjustable period settable by means of a control 104. This signal is superimposed on the d.c. gain control voltage from circuit 108, on line 106. Consequently, when signal J is low the gain of amplifier 90 is held at a reduced level so the video signal is attenuated. As signal J gradually rises, the gain of amplifier 90 is increased until the video signal is amplified in normal manner. By adjusting control 104 on sea clutter circuit 102, and thus adjusting the timing of the trailing edge of signal J, the display of echoes received from rough water around the boat can be attenuated to any desired distance out from the centre of the display screen.

MAGNETRON CAPACITOR CHARGING

The above explains the events occurring while the CRT spot is sweeping from the screen centre to the screen periphery i.e. up to the termination of ramp signal Q in FIG. 3. It is a feature of the described embodiment that during this period no power is drawn from the d.c. power supply circuit 110 for the purpose of recharging the magnetron driving capacitor 34, which became partly discharged when the magnetron was fired immediately after the beginning of the cycle. However, once the CRT scan has been completed a further sequence of events is initiated to recharge capacitor 34 ready for the next radar pulse to be transmitted. This is achieved as follows.

The delay in the initiation of capacitor charging is effected by means of a stand-off period circuit 112. In response to the leading edge of signal R from the 3μs delay circuit 28, the output of stand-off period circuit 112 goes low (signal T) for a predetermined period of time. That period terminates just after the spot scan has been completed at which time the output of stand-off period circuit 112 goes high, and the leading edge thus generated triggers a charging period circuit 114 which, in response, generates an output signal U having a predetermined length. Signal U is applied to a pulse number generator 116, which is an independent oscillator, and which generates a train of pulses V so long as it is receiving the pulse U from circuit 114. Consequently, the length of pulse U determines the number of pulses V generated by generator 116.

The pulses V are applied to a pulse width monostable circuit 118. This generates an output pulse for each input pulse received, but the width of each output pulse can be varied in a manner, and for a purpose, which will be described below. The output pulses from pulse width monstable 118 are applied to a pulse generating circuit 120 (which will be described in more detail with reference to FIG. 4) which for each input pulse received applies a pulse of charge to capacitor 34, thereby eventually charging the capacitor to a voltage in the region of 300 volts. Charging of capacitor 34 ceases when the predetermined number of pulses in waveform V have been completed. The circuit is then in a condition ready for transmission of the next radar pulse by energisation of magnetron 2, and simultaneous initiation of the next sweep of the CRT beam.

On small boats, the standard form of power supply 110 (from which various supply voltages for all those circuit components needing them may be derived in ways known in themselves) is a 12 volt battery charged from the propulsion motor or from a generator motor. However, the operating conditions are normally such that the voltage available from supply 110 may vary between 11 volts and about 16 volts. In prior radar units, the circuitry for charging the magnetron energising capacitor has been designed so as to be operable from an input voltage of about 10 volts so that there will always be an adequate input voltage for its operation despite the fluctuations in the output voltage from the power supply. However, to avoid excessive loading of the capacitor charging circuitry when the supply voltage rises substantially above 10 volts, as is often the case, relatively complex voltage stabiliser circuitry has been employed which in effect dumps power when the output of supply 110 is significantly above 10 volts. This power is dissipated in heat sinks and of course represents an undesirable waste of power consumption in the radar unit. In the embodiment being described, the need for a complex voltage stabiliser for supplying the capacitor charging circuitry, with its attendant cost, and the undesirable waste of power which has been involved, are avoided as follows.

A voltage sensor circuit 122 continually senses the output voltage of power supply 110. So long as the sensed voltage remains below a certain threshold level which will not overload the capacitor charging circuitry, voltage sensor 122 produces no output signal on line 124. However, when the sensed voltage rises above this threshold level a proportionate signal is developed on line 124 and applied to the charging period circuit 114. This is a monostable circuit whose output pulse (signal U) has a constant length in the absence of a signal on line 124 but whose time constant is reduced, with consequent reduction in the length of the output pulse, in proportion to the value of any input signal applied on line 124. Consequently, as the supply voltage from power supply 110 rises above the threshold value the resultant output signal from voltage sensor 122 causes a proportionate reduction in the length of pulse U delivered by charging period circuit 114 to pulse number generator 116, and thus a corresponding reduction in the number of pulses in signal V applied to the pulse width monostable 118. Consequently the number of pulses (but not their width) in the output from pulse width mono 118 is correspondingly reduced and so is the number of pulses of charge delivered by pulse generator 120 to capacitor 34. The pulses delivered from pulse generator 120 to capacitor 34 are derived from the power supply 110 and the amount of charge in each pulse is therefore proportional to the instantaneous value of the output voltage of supply 110. Consequently, when this voltage rises each pulse applied to capacitor 34 contains more charge but by means of the circuitry which has just been described the total number of pulses applied to the capacitor 34 to charge it is reduced. Consequently, the amount of charge applied to capacitor 34 is kept substantially constant even though the output voltage of power supply 110 may rise very substantially above the threshold level set at voltage sensor 122. It can be appreciated that in this way the circuitry takes only so much power as it needs for adequate charging of the capacitor and there is no necessity for any power to be dumped.

The separation, in time, of the CRT beam scan and the capacitor charging step has various advantages. Both these processes require significant current from the power supply 110. By avoiding drawing both currents simultaneously, line losses in the conductive paths (especially in those paths which carry both the currents) are reduced, thus further reducing power consumption. Also it is the practice to design all circuitry for satisfactory operation when the power supply voltage is about 10% below its normal level (e.g. 12 volts). The reduction in peak current consumption achieved by non-overlap of the two currents reduces the proportion of this margin which is absorbed by line losses and therefore less constraint is placed on the design of the circuitry. Also, since the high energy transitions involved in capacitor charging do not occur while the receiver/CRT scan are active, the internal filtering required to prevent the former interfering with the latter can be simplified, saving cost.

FIG. 4

Some aspects of charging and discharging capacitor 34 will now be described in more detail with reference to FIG. 4.

Pulse generator 120 is shown within the broken-line box, supplied with power from the positive line 126 (see connection Y-Y in FIG. 2) and the common line 128 of power supply 110, and receiving its control signal from the output of pulse width monostable 118.

Each output pulse from monostable 118 renders conductive a transistorised switching circuit 130 so that a supply voltage pulse is applied to the primary 132 of a pulse transformer generally indicated at 134. This generates an output pulse of higher voltage and of a length proportional to the length of the pulse from monostable 118 across the secondary 136 of the pulse transformer. The polarity of the pulse is such as to pull charge through a diode 138 onto a capacitor 140 and, via a diode 142 onto the main capacitor 34. When the voltage across secondary 136 overshoots in the opposite direction further charge is driven from capacitor 140 through diode 142 onto capacitor 34. As already mentioned, the number of pulses thus applied to capacitor 34 is automatically adjusted so as to ensure that it is kept charged to a voltage of approximately 300 volts.

Charge is stored on capacitor 34 until the firing pulse is delivered by magnetron pulse width monostable 30. This is applied to the switch shown as block 32 in FIG. 2 which, in the preferred embodiment, is a solid state switching device having very high input impedance, capable of switching pulsed current of up to 16 amps. at 360 volts and with very fast on and off switching times preferably in the region of 100 ns. An n-channel enhancement mode VMOS power FET is preferably employed and, in particular, model VN4000A or VN4001A available from Siliconix Limited of Newbury, Berkshire, England. The input of the FET is protected by an 18 volts Zener diode 144 and the output by six such diodes 146 which limit the voltage across the output electrodes to 360 volts. When FET 32 is switched on by pulse S capacitor 34 is discharged through the primary 148 of pulse transformer 36, thus generating in its secondary 150 a voltage pulse in the region of 2000 volts which is applied by line 152 to the anode 154 of magnetron 2. The resultant oscillation of the magnetron makes available at its output port 155 a radar frequency pulse having a power in the vicinity of 1 kw which is applied to the transmitting section 4a of scanner 4, in known manner, the duration of the pulse corresponding to the duration of the output pulse S of magnetron pulse width monostable 30.

It should be appreciated that the use of a low powered, low voltage circuit for generating the firing pulse S, with the pulse-width being controllable by a variable voltage control signal, in conjunction with a solid state switching device with fast switching times and the ability to switch a high power input provides an economical and reliable way of energising a magnetron with controlled width pulses, whether in the context of radar equipment or otherwise.

A diode 157 protects switch 32 against the reverse phase overshoot voltage which can be developed by primary 148 in response to the trailing edge of the pulse induced in secondary 150.

A parallel RC circuit 156, 158, which is not essential for operation, has terminals 160 connected across it, to which an instrument can be connected to check the magnetron output power.

The above description of the magnetron switching effectively assumes that the lower end of RC circuit 156, 158 is connected to common line 128, so that magnetron anode 154 starts at zero potential as is normal. In fact, a more advantageous arrangement is shown in which the lower end of RC circuit 156, 158 and therefore in effect the anode 154 of the magnetron is connected by a line 166 to a biassing potential which is provided by a voltage doubling arrangement generally indicated at 168 and comprising diodes 170 and 172 and capacitors 174 and 176 connected as shown. In response to the input pulses applied to capacitor 140, this produces a voltage of approximately 600 volts on line 166 so that prior to switching on the magnetron its anode is at approximately 600 volts relative to its cathode.

In this way, the voltage needing to be developed across secondary winding 150 to fire the magnetron is reduced so the turns ratio of pulse transformer 36 can be reduced. This increases the bandwidth of the transformer which in turn enables a wider range of pulse widths to be switched by the transformer than would otherwise be the case.

Also, the amount of power which has to be switched by switch 32 is reduced thus increasing circuit reliability.

The bias applied to the magnetron anode should be below the threshold level at which oscillation could be induced. A lower bias than that described may be achieved by omitting circuit 168 and connecting the lower end of RC circuit 156, 158 to capacitor 34 to bias the magnetron anode to around 300 volts, but with reduced benefits.

RANGE CHANGING

In a practical embodiment, six different ranges, namely 0.5, 1.0, 2.0, 4.0, 8.0 and 16.0 miles are made available. For the first two, the 4000 Hz repetition rate is employed by selecting waveform A at range switch section 24a. For the middle two ranges waveform B (2000 Hz) is selected and for the two longest ranges waveform C (1000 Hz) is selected. Consequently the operating cycle of radar pulse transmission, CRT beam scan, and capacitor recharge is repeated at one of these three rates according to whether one of the shortest, middle, or longest pairs of ranges is selected.

It has already been mentioned that on a longer range setting a longer radar pulse is desired and on a shorter range setting a shorter radar pulse is desired. Additionally, since the whole operating cycle of the system is shorter at short ranges than it is at long ranges, the stand-off period set by circuit 112 needs to be made shorter for short ranges and longer for long ranges, and the length of the capacitor charging pulses, determined by pulse width monostable 118, needs to be greater when longer radar pulses are to be developed, because a greater amount of power is taken by each radar pulse. The circuits 30, 112 and 118 which respectively determine radar pulse length, stand-off period and charging pulse length are all monostable circuits and it is a preferred feature that the time constants of these circuits be voltage-controllable. Circuits of this kind are in themselves known, in which the circuit time constant is inversely proportional to a d.c. voltage applied to a control terminal of the circuit. For example, Motorola MC145283 monostables may be used with external resistor values made voltage-selectable by diode switching in response to applied control voltage. Referring to FIGS. 1 and 2, a d.c. control voltage generating circuit 162 at the scanning unit is ganged with the range switch and produces an output of 0, 6 or 12 volts (the higher voltages being for the shorter ranges) which is superimposed on the trigger signal F on line 26 for transmission to the scanner unit. At the scanner unit the superimposed d.c. voltage is applied by line 164 and lines 30a, 112a and 118a to control terminals on the monostable circuits 30, 112 and 118 respectively. (Since a combination of pulse signals (F) and d.c. level signals is present on line 26, suitable isolating and decoupling arrangements are of course provided at circuits 28, 30, 112 and 118 for ensuring that they respond only to the desired signals). This enables the time constants of these three circuits (which in general will be different from each other) to be selectively set to any of three different values, one for each of the three repetition rates, by operation of the range switch at the display unit.

The above characteristics of the circuit are set the same for both of the ranges in one pair (i.e. longest two, middle two or shortest two). However it is evident that for the two ranges in a pair the scan speeds and scan periods of the CRT beam must differ by a factor of two. Hence six different division ratios are provided at the output of divider 46, each differing from the next by a factor of two, so as to define six different values for the length of the output pulse H from scan coil driver 42, one for each range. This sets the required six different scan periods for the CRT beam and, as already explained, the corresponding different values of inductance set by switching of circuit 44 in response to the range switch ensure that the beam will be fully deflected in each different scan period, thus giving the six scan speeds.

Further, in order that the range rings and the bearing mark dashes may be identical irrespective of the CRT scan speed being employed, the frequencies of the signals for generating them are increased in proportion to scan speed by providing six output frequencies (each differing from the next by a factor of two) from each of dividers 52 and 84, the appropriate one being selected at each range due to the ganging of range switch sections 24b, 24c and 24d.

MECHANICAL ARRANGEMENTS

Figure 2:
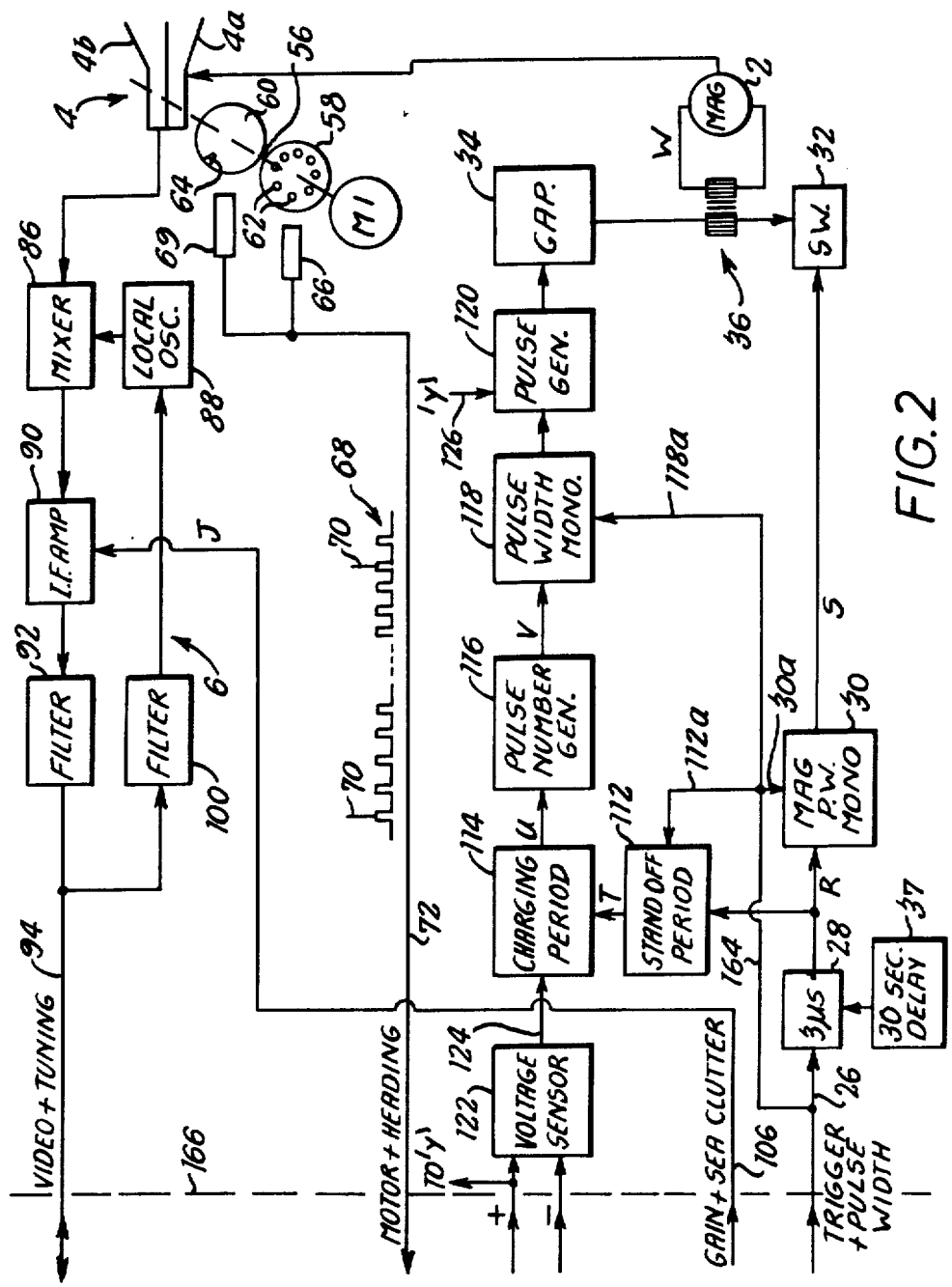
FIG. 2 shows the components which are located within the scanning unit, the components in FIG. 2 being linked to those in FIG. 1 by conductors as indicated.

With the exception of the motor M1 and the rotation sensing devices 68 and 66, all the components shown in FIG. 2 are contained in a single assembly with the scanner 4 and rotate with the scanner. The broken line 166 indicates diagrammatically the existence and position of five slip rings for transferring power and signals on the five conducting paths which link the stationary and rotating parts of the equipment (line 72 does not need a slip ring because units 66 and 69 do not rotate). The use of slip rings is of course well known for this purpose but in prior radar systems for small boats as many as twelve slip rings have been required.

In the present system, the number of slip rings, and consequently the cost and liability to malfunction, is reduced by superimposing signals having different functions on a common conductor, and in particular by putting both the video and local oscillator tuning signals on a single conductor 94, the gain and sea clutter signals on a single conductor 106 and the trigger and transmitted pulse width signals on a single conductor 26. Further, by also putting both the motor synchronisation and heading indicating signals on a single conductor 72, a total of only six conductors are required including the two which carry the positive and negative power supply potentials to the rotating scanner unit.

These conductors are taken from the scanning unit, which will be located at a high point on the boat, to the display unit which will be normally located in the hull of the boat, by means of an insulated multicore conductor which in many cases will be of substantial length. Such conductors are expensive and therefore the reduction of the number of cores required enables a substantial saving in the cost of the length of the cable.

MODIFICATION OF FIG. 4

Control of the charging of capacitor 34 to provide appropriate energy for driving the magnetron, in direct response to the level of the supply voltage, has already been described with reference to FIGS. 2 and 4.

Figure 4:
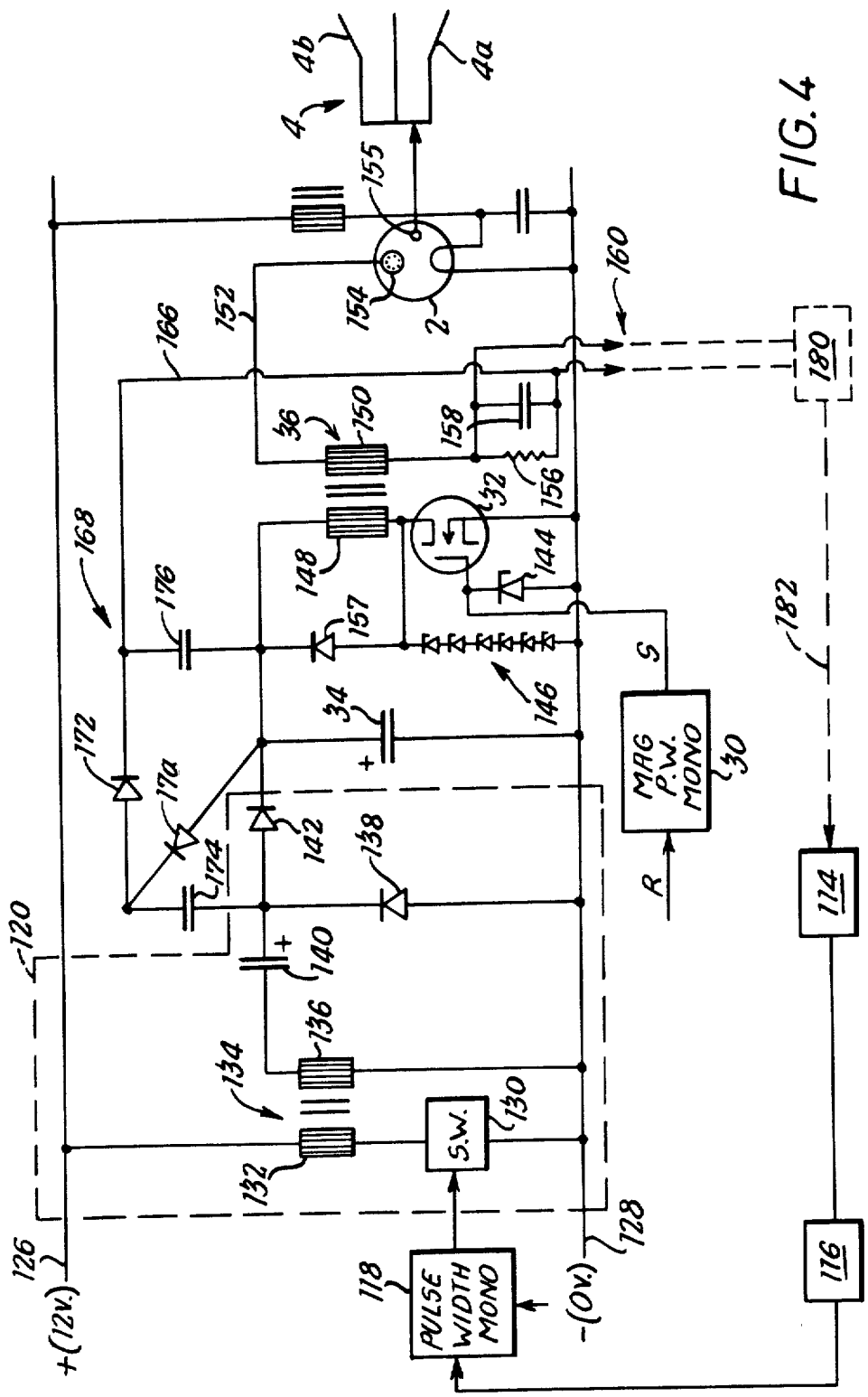
FIG. 4 shows in more detail the circuitry which is used for storing the energy required to fire the magnetron, and for firing the magnetron, as more generally illustrated in FIG. 2.

An alternative form of control, in this case responsive indirectly to supply voltage, is shown by broken lines in FIG. 4. The mean voltage across resistor 156 will be proportional to the mean current delivered to magnetron 2. A control circuit 180 shown in broken lines detects this mean voltage and in response develops a control signal which is applied on line 182 to the charging period circuit 114, in place of the voltage sensor signal used in the previously described version. Circuit 180 is adapted to cause circuit 114 to increase the charging period (and hence number of capacitor charging pulses) in response to a detected fall in magnetron mean current and to decrease it in response to a rise, whereby to control capacitor charging such that the magnetron is always fully driven but not over-driven, irrespective of the supply voltage. Again, this is achieved while charging the capacitor from an unstabilized supply voltage without dumping power.

It should be appreciated that the control signal from circuit 180 could be used to control capacitor charging by altering the width of the charging pulses rather than their number.

If the magnetron output pulse repetition frequency and output pulse length are kept in inverse proportion when changing from one range to another, the desired mean magnetron current will not alter from range to range. However, if this is not the case, control circuit 180 is designed so as to be settable by the range switch so as to control mean magnetron current at different, appropriate, levels depending on the range setting.

So far as is known, previous radar equipment for use on small boats has not used less than 48 watts power. The various power saving features which have been described above are capable in practice of giving power consumption of about half this much, which is a very substantial advantage since it makes the present system feasible for use on a very large number of small boats whose power supply systems would not be adequate to power previously available radar equipment. Further, this reduction in power consumption may be achieved even using a 90° deflection CRT rather than a 50° deflection CRT as is commonly employed in small boat radar.

I claim:

1. A circuit for generating high frequency output pulses comprising a magnetron having input terminals, a pulse transformer having primary and secondary windings, the secondary winding being coupled to the magnetron input terminals to apply firing pulses thereto, capacitive charge storage means arranged for direct discharge through the primary winding of the pulse transformer, a semiconductor switching device having output terminals which are connected in series with said primary winding and having a control terminal, and a control circuit adapted to deliver to said control terminal pulses of predetermined length, the semiconductor switching device being responsive to a said pulse at its control terminal to conduct and discharge the charge storage means through the primary winding of the pulse transformer for a period determined by the length of said pulse whereby a firing pulse and a resulting high frequency output pulse are generated which have pulse lengths also determined by the length of said pulse.

2. A circuit as claimed in claim 1, wherein the semiconductor switching device is a power FET.

3. A circuit as claimed in claim 2, wherein said power FET is a VMOS power FET.

4. A circuit as claimed in claim 3, wherein said VMOS power FET is an n-channel enhancement mode VMOS power FET.

5. A circuit as claimed in claim 1, wherein said control circuit is adapted to deliver pulses whose lengths are predetermined but variable.

6. A circuit as claimed in claim 5, wherein said control circuit is a monostable circuit having voltage-controllable time constant whereby to deliver said variable-length pulses.

7. A circuit as claimed in claim 1, wherein diode means is connected in parallel with said primary winding and is poled so as to conduct in response to a voltage induced in the primary winding in response to the trailing edge of a firing pulse generated in said secondary winding.

8. A circuit as claimed in claim 1, wherein voltage limiting means is connected in parallel with the switching device output terminals.

9. A circuit as claimed in claim 1, wherein voltage limiting means is connected to the control terminal of the switching device.

* * * * *